(12) United States Patent
Clevenger et al.

(10) Patent No.: US 9,640,765 B2
(45) Date of Patent: May 2, 2017

(54) CARBON NANOTUBE DEVICE

(71) Applicant: GLOBALFOUNDRIES Inc., Grand Cayman (KY)

(72) Inventors: Lawrence A. Clevenger, Rhinebeck, NY (US); Chandrasekhar Narayan, San Jose, CA (US); Gregory A. Northrop, Ballston Spa, NY (US); Carl J. Radens, LaGrangeville, NY (US); Brian C. Sapp, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/190,365

(22) Filed: Jun. 23, 2016

(65) Prior Publication Data
US 2016/0336515 A1   Nov. 17, 2016

Related U.S. Application Data

(62) Division of application No. 13/960,877, filed on Aug. 7, 2013, now Pat. No. 9,406,888.

(51) Int. Cl.
| | |
|---|---|
| *H01L 51/00* | (2006.01) |
| *H01L 29/775* | (2006.01) |
| *H01L 29/66* | (2006.01) |
| *B82Y 40/00* | (2011.01) |
| *B82Y 10/00* | (2011.01) |
| *H01L 29/06* | (2006.01) |
| *H01L 51/05* | (2006.01) |

(52) U.S. Cl.
CPC ......... *H01L 51/0048* (2013.01); *B82Y 10/00* (2013.01); *B82Y 40/00* (2013.01); *H01L 29/0673* (2013.01); *H01L 29/66439* (2013.01); *H01L 29/775* (2013.01); *H01L 51/0012* (2013.01); *H01L 51/0541* (2013.01); *Y10S 977/742* (2013.01); *Y10S 977/842* (2013.01)

(58) Field of Classification Search
USPC .... 257/E23.039, E27.084, E27.092, E51.04, 257/296, 300, 301, 68, 71; 438/243, 386, 438/775
See application file for complete search history.

(56) References Cited

U.S. PATENT DOCUMENTS

| | | |
|---|---|---|
| 6,286,226 B1 | 9/2001 | Jin |
| 6,333,598 B1 | 12/2001 | Hsu et al. |
| 6,340,822 B1 | 1/2002 | Brown et al. |

(Continued)

OTHER PUBLICATIONS

Tang et al. "Aligned Carbon Nanotubes Obtained Using a Surfactant Bubble"; http://iramis.cea.fr/en/Phocea/Vie_des_labos/Ast/ast_visu.php?id_ast=1579.

(Continued)

*Primary Examiner* — Telly Green
(74) *Attorney, Agent, or Firm* — Yuanmin Cai; Hoffman Warnick LLC

(57) ABSTRACT

Embodiments of the present invention provide a method of forming carbon nanotube based semiconductor devices. The method includes creating a guiding structure in a substrate for forming a device; dispersing a plurality of carbon nanotubes inside the guiding structure, the plurality of carbon nanotubes having an orientation determined by the guiding structure; fixating the plurality of carbon nanotubes to the guiding structure; and forming one or more contacts to the device. Structure of the formed carbon nanotube device is also provided.

8 Claims, 7 Drawing Sheets

(56) References Cited

U.S. PATENT DOCUMENTS

| | | |
|---|---|---|
| 6,515,325 B1 | 2/2003 | Farnworth et al. |
| 6,566,704 B2 | 5/2003 | Choi et al. |
| 6,599,808 B2 | 7/2003 | Kim et al. |
| 7,253,065 B2 | 8/2007 | Appenzeller et al. |
| 7,365,003 B2 | 4/2008 | Ravi et al. |
| 7,507,987 B2 | 3/2009 | Kim et al. |
| 7,518,247 B2 | 4/2009 | Sakamoto et al. |
| 7,700,978 B2 | 4/2010 | Okita |
| 7,960,713 B2 | 6/2011 | Hunt et al. |
| 8,034,676 B2 | 10/2011 | Okita |
| 8,174,084 B2 | 5/2012 | Farahani et al. |
| 8,299,605 B2 | 10/2012 | Basker et al. |
| 8,586,393 B2 | 11/2013 | Farahani et al. |
| 8,912,522 B2 | 12/2014 | Rubloff et al. |
| 8,933,559 B2 | 1/2015 | Basker et al. |
| 2002/0048143 A1 | 4/2002 | Lee et al. |
| 2002/0159944 A1 | 10/2002 | Smalley et al. |
| 2002/0163079 A1 | 11/2002 | Awano |
| 2003/0132461 A1 | 7/2003 | Roesner et al. |
| 2003/0165418 A1 | 9/2003 | Ajayan et al. |
| 2003/0179559 A1 | 9/2003 | Engelhardt et al. |
| 2003/0211724 A1 | 11/2003 | Haase |
| 2004/0016928 A1 | 1/2004 | Ravi et al. |
| 2004/0137730 A1 | 7/2004 | Kim et al. |
| 2004/0137740 A1 | 7/2004 | Chung et al. |
| 2005/0056826 A1 | 3/2005 | Appenzeller et al. |
| 2005/0062034 A1 | 3/2005 | Dubin |
| 2005/0255613 A1 | 11/2005 | Kim et al. |
| 2006/0086958 A1 | 4/2006 | Eimori |
| 2006/0138658 A1 | 6/2006 | Ravi et al. |
| 2006/0276056 A1 | 12/2006 | Ward et al. |
| 2006/0281306 A1 | 12/2006 | Gstrein et al. |
| 2007/0248794 A1 | 10/2007 | Gstrein et al. |
| 2008/0067619 A1 | 3/2008 | Farahani et al. |
| 2008/0311424 A1 | 12/2008 | Choi et al. |
| 2009/0014767 A1 | 1/2009 | Furukawa et al. |
| 2009/0121343 A1 | 5/2009 | Basker et al. |
| 2009/0166686 A1 | 7/2009 | Hunt et al. |
| 2009/0181535 A1 | 7/2009 | Sakamoto et al. |
| 2010/0108976 A1 | 5/2010 | Jayasekara et al. |
| 2010/0132771 A1 | 6/2010 | Lu |
| 2010/0144104 A1 | 6/2010 | Okita |
| 2010/0295025 A1 | 11/2010 | Appenzeller et al. |
| 2011/0057322 A1 | 3/2011 | Matsunaga et al. |
| 2011/0147715 A1 | 6/2011 | Rogers et al. |
| 2011/0177493 A1 | 7/2011 | Lu |
| 2012/0138902 A1 | 6/2012 | Hunt et al. |
| 2012/0168931 A1 | 7/2012 | Basker et al. |
| 2012/0193734 A1 | 8/2012 | Farahani et al. |
| 2014/0013855 A1 | 1/2014 | Farahani et al. |

OTHER PUBLICATIONS

Lee et al. "Preparation of Hierarchically Aligned Carbon Nanotube Films Using the Langmuir-Blodgett Technique"; http://www.ncbi.nlm.nih.gov/pubmed/19908732.

Armitage et al. "Quasi-Langmuir-Blodgett Thin Film Deposition of Carbon Nanotubes"; Journal of Applied Physics—vol. 95; No. 6; Mar. 15, 2004.

CARBON NANOTUBE DEVICE

FIELD OF THE INVENTION

The present invention relates generally to the field of semiconductor device manufacturing. In particular it relates to method of forming carbon nanotube devices and structures formed thereby.

BACKGROUND

With constant adoption of state of art manufacturing processes, performances of semiconductor devices formed thereby, such as field-effect-transistors (PET) and dynamic random access memories (DRAM), have seen their steady improvement. Nevertheless, performances of these devices are still negatively affected by various factors, among which there are leakage current and static power dissipation. Not just that, unfortunately, both leakage current and static power dissipation have been increasing at a rate that is much faster than dynamic current and signal power dissipation which, unlike leakage current and static power dissipation, actually contribute to the performances improvement of semiconductor devices.

On the other hand, various research works and recently published papers are pointing toward a new direction suggesting that carbon nanotubes (CNT) may be able to offer a solution to the above concerns currently facing and impacting semiconductor device performance. For example, CNT has been demonstrated to possess a much lower electronic resistance, when being compared with some traditional semiconductor materials, which in turn means that CNT may be able to keep static heat or power dissipation low when being used in a semiconductor device to pass electric current. Despite the above suggested potential advantages, integrating CNT into currently existing semiconductor device manufacturing processes, such as a CMOS (complementary metal-oxide-semiconductor) fabrication process flow is known to be rather challenging.

BRIEF SUMMARY OF EMBODIMENTS

Embodiments of present invention provide a method of forming semiconductor devices that use carbon nanotubes. In one embodiment, the method includes creating a guiding structure in a substrate for forming a device; dispersing a plurality of carbon nanotubes inside the guiding structure, the plurality of carbon nanotubes having an orientation determined by the guiding structure; fixating the plurality of carbon nanotubes to the guiding structure; and forming one or more contacts to the device.

In one embodiment, fixating the plurality of carbon nanotubes to the guiding structure includes depositing a dielectric layer inside the guiding structure, the dielectric layer being directly on top of the plurality of carbon nanotubes and holding the plurality of carbon nanotubes in place against the guiding structure.

One embodiment of present invention further includes, before depositing the dielectric layer inside the guiding structure, subjecting the plurality of carbon nanotubes to a thermal annealing process, the thermal annealing process causes the plurality of carbon nanotubes to become flexible and substantially line bottom and sidewall surfaces of the guiding structure.

In one embodiment, dispersing the plurality of carbon nanotubes includes placing at least one layer of the carbon nanotubes at a bottom surface of the guiding structure, the one layer of the carbon nanotubes covers a substantial portion of the bottom surface.

In another embodiment, forming the one or more contacts includes forming the one or more contacts inside the dielectric layer wherein at least one of the one or more contacts is in contact with the one layer of the carbon nanotubes.

In yet another embodiment, forming the one or more contacts includes forming at least one of the one or more contacts to be substantially close to but not in contact with the plurality of carbon nanotubes.

According to one embodiment, the guiding structure is a shallow trench of a rectangular shape, having a long side A and a short side B, formed inside the substrate, wherein the long side A is at least 4 times longer than that of the short side B.

According to another embodiment, the orientation of the carbon nanotubes follows a direction of the long side A of the rectangular shape of the shallow trench.

Embodiment of present invention provides a method of forming carbon nanotube devices. The method includes creating multiple guiding structures in a substrate; dispersing a plurality of carbon nanotubes inside the multiple guiding structures, the plurality of carbon nanotubes aligning in an orientation determined by the multiple guiding structures; fixating the plurality of carbon nanotubes to the multiple guiding structures; and forming one or more contacts accessing the plurality of carbon nanotubes.

Embodiment of present invention also provides a semiconductor device, which includes a layer of carbon nanotubes embedded inside a dielectric layer; a first conductive contact formed inside the dielectric layer, the first conductive contact being substantially close to but not in contact with the layer of carbon nanotubes; and a second and a third conductive contacts formed inside the dielectric layer next to a right side and a left side of the first conductive contact, the second and third conductive contacts being in contact with the layer of carbon nanotubes.

BRIEF DESCRIPTION OF THE DRAWINGS

The present invention will be understood and appreciated more fully from the following detailed description of preferred embodiments, taken in conjunction with the accompanying drawings of which.

Figure 1A:
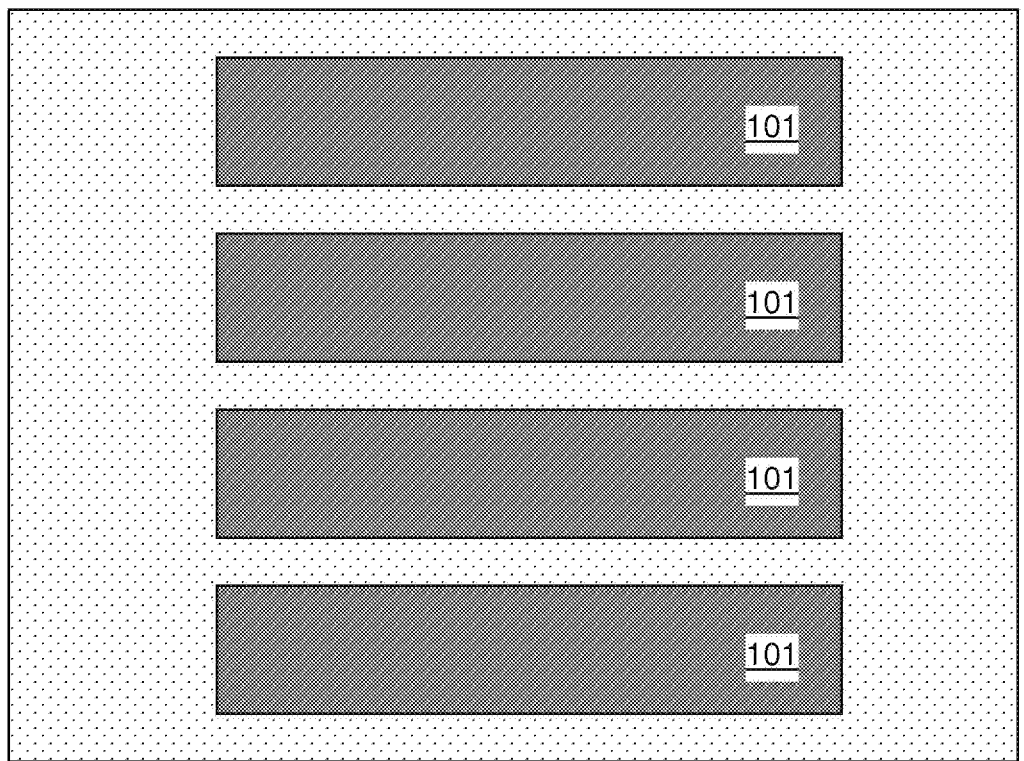
FIGS. 1(a) and 1(b) are demonstrative illustrations of top and cross-sectional views of a step of a method of forming semiconductor devices using carbon nanotubes according to an embodiment of present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the present invention.

Figure 1B:
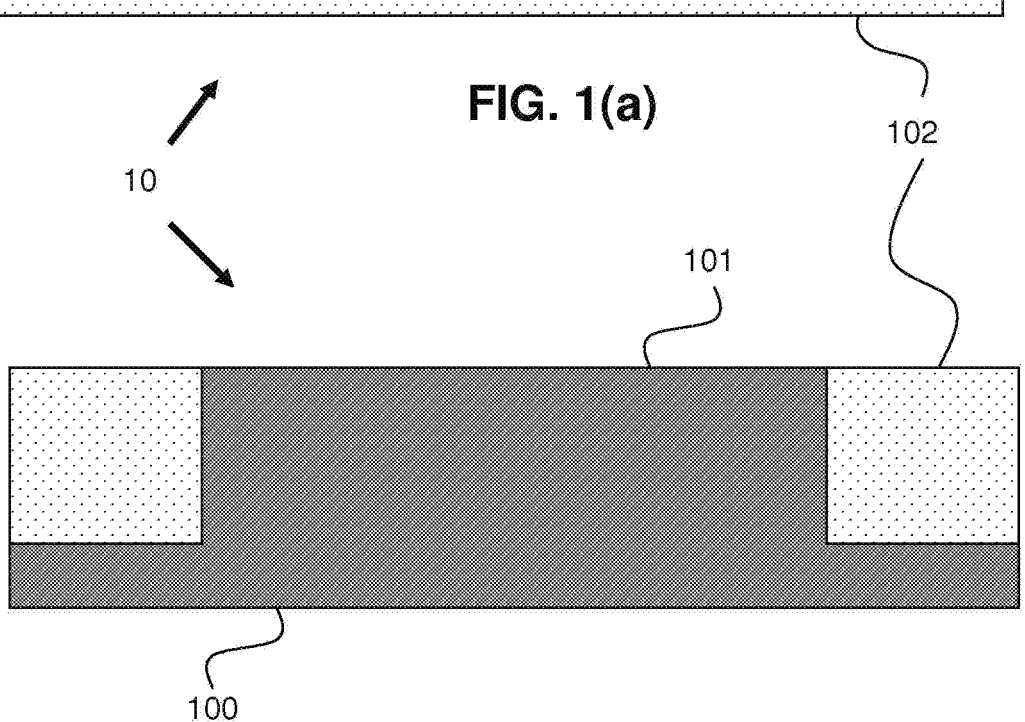

FIG. 1(a) and FIG. 1(b) are demonstrative illustrations of top and cross-sectional views of a step of a method of forming a semiconductor device using carbon nanotubes according to an embodiment of present invention. More specifically, one embodiment of method of the present invention includes providing, preparing, or supplying a substrate 100 upon which semiconductor device 10 is to be formed. Substrate 100 may be a semiconductor substrate of bulk silicon (Si), doped silicon, silicon-germanium (SiGe), or silicon-on-insulator (SOI), to list a few as non-limiting examples, and may be a substrate of other suitable materials, such as a layer of dielectric material, that is able to host devices and withstand device manufacturing processes applied thereupon. In the below description, for purpose of simple description without losing generality, substrate 100 is presumed to be a silicon substrate although similar description may be equally applied to situations of other substrate materials.

In one embodiment, the method of present invention includes forming an insulating structure 102 such as a shallow trench isolation (STI) structure that surrounds one or more areas 101 of substrate 100 that are designated for forming semiconductor device 10. Each of the designated device area 101 may be in a shape of, for example, rectangular or substantially close to rectangular within which carbon nanotubes may be used to form semiconductor device 10, as being described below in more details. STI 102 may be formed by any currently existing or future developed processes and/or techniques such as, for example, by a lithographic patterning and etching process, which creates recesses into substrate 100, followed by a deposition process, which deposits dielectric material back into the created recesses to form STI 102. STI 102 may be made to have a depth, measured from a top surface of substrate 100, sufficiently deep in order to surround carbon nanotube devices that are to be made in the designated device areas 101, as being described below in more details with reference to FIGS. 2(a) and 2(b). The deposition process may be followed by a chemical-mechanic-polishing (CMP) process to create a flat top surface of STI 102, which becomes co-planar with the top surface of substrate 100.

Figure 3A:
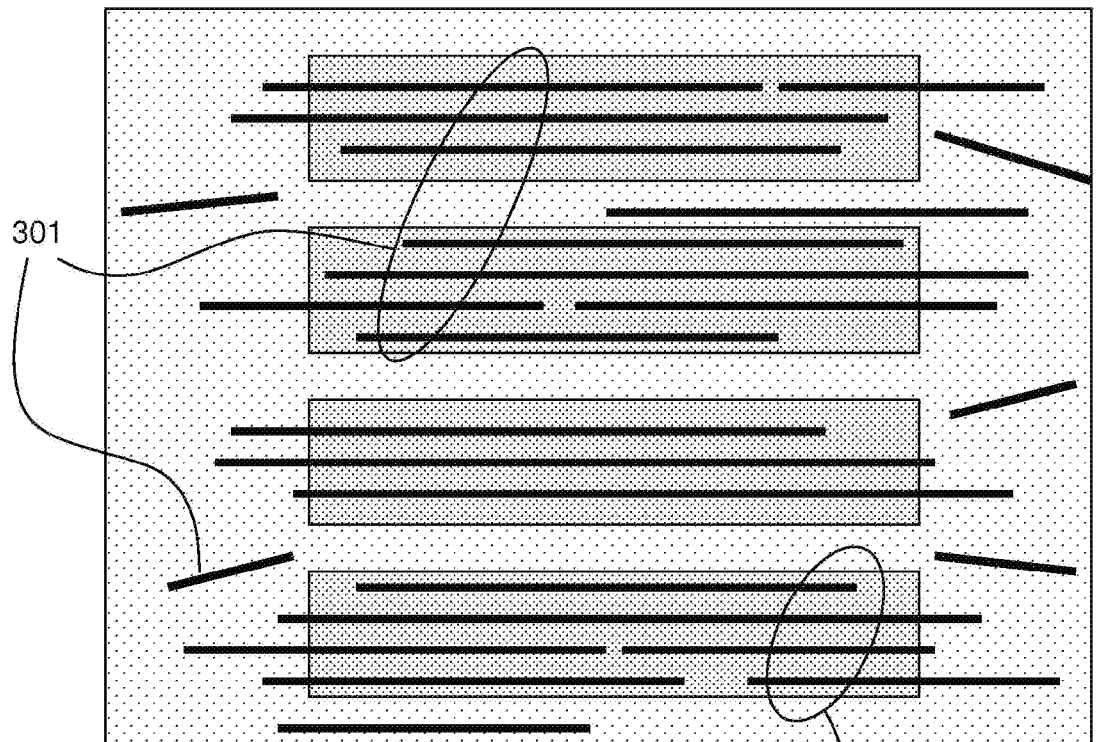
FIGS. 3(a) and 3(b) are demonstrative illustrations of top and cross-sectional views of a step of a method of forming semiconductor devices using carbon nanotubes, following the step illustrated in FIGS. 2(a) and 2(b), according to an embodiment of present invention.
Figure 3B:
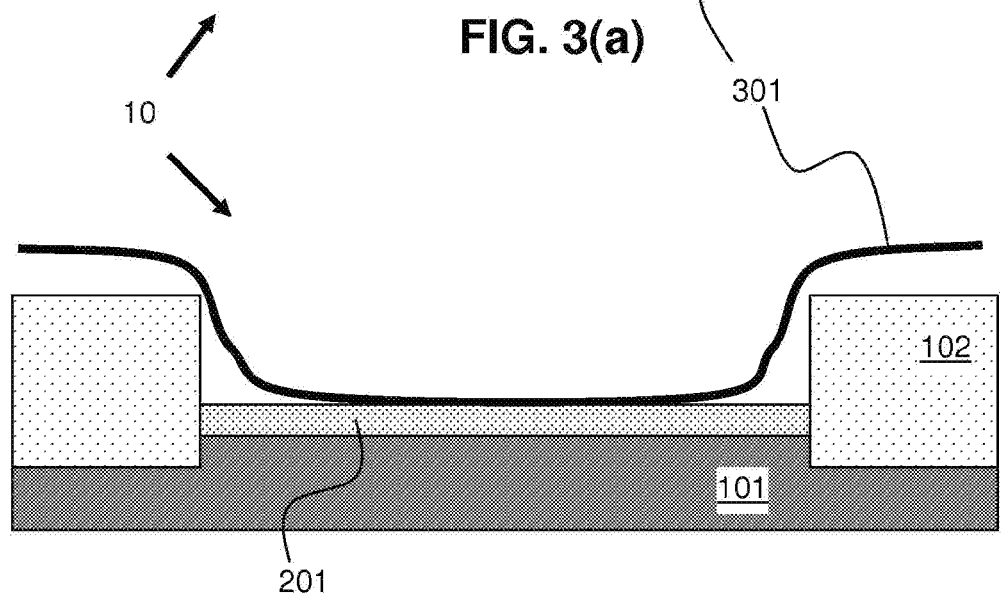

Device area 101 of rectangular shape may have a long side A and a short side B of about 40 nm by 10 nm in dimension preferably. In one embodiment the long side A may be around 10 to 40 nm and the short side B may be around 2 to 10 nm, and the long side A may be at least 4 times longer than the short side B. All of the device areas 101 may be oriented in a same direction and thus may be formed in parallel to each other. However, embodiments of present invention are not limited in this aspect and device areas of other shapes may possibly be used as well and in some instances device areas 101 may not necessarily be formed in parallel to have the same orientation. For example, in one embodiment, some of the device areas 101 may be placed perpendicular to some other device areas 101 such that devices formed therein may have two different orientations. Orientation of one device area 101 may determine orientation of carbon nanotubes that are placed or dispersed therein, as being described below in more details with reference to FIGS. 3(a) and 3(b).

Figure 2A:
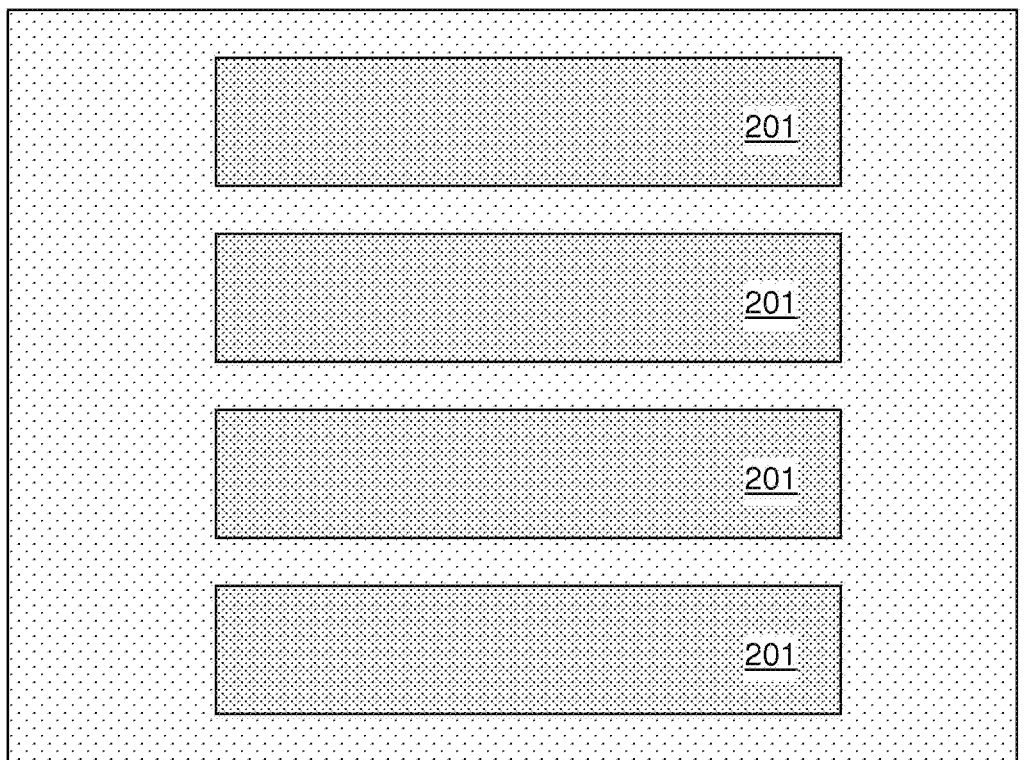
FIGS. 2(a) and 2(b) are demonstrative illustrations of top and cross-sectional views of a step of a method of forming semiconductor devices using carbon nanotubes, following the step illustrated in FIGS. 1(a) and 1(b), according to an embodiment of present invention.
Figure 2B:
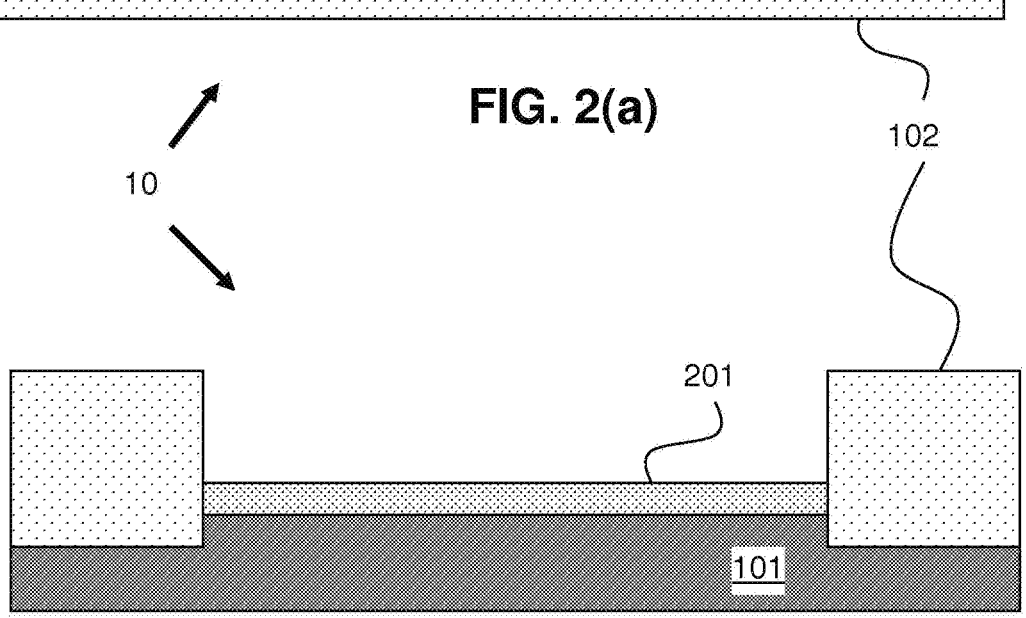

FIG. 2(a) and FIG. 2(b) are demonstrative illustrations of top and cross-sectional views of a step of a method of forming a semiconductor device using carbon nanotubes according to an embodiment of present invention, following the step illustrated in FIG. 1(a) and FIG. 1(b). More specifically, one embodiment of the method of present invention includes recessing device areas 101 that are defined by their surrounding STI 102 to reduce the height thereof to a level below that of surrounding STI 102. The recessing may be achieved by etching the silicon material of substrate 100, selectively relative to the material of surrounding STI 102 thereby without affecting or removing or at least substantially affecting or removing surrounding STI 102. Here, in order to achieve proper selective etching, dielectric materials that are used to form surrounding STI 102 may be carefully selected or chosen during the formation thereof, as in the previous step being described above with reference to FIGS. 1(a) and 1(b), such that it is at least substantially etch-selective to the material of substrate 100.

In one embodiment, recessing of device areas 101 may be controlled such that sidewalls of the recessed areas are fully surrounded by STI 102. In other words, the depth of the recessed areas may be made to be less than the depth of STI 102. After forming recesses in designated device areas 101, an insulating layer 201, such as an oxide layer, may be formed on top of the underneath exposed silicon substrate 100. The insulating layer 201 may be formed through, for example, oxidizing a top portion of the exposed silicon substrate 100 in an oxidizing ambient environment at a temperature in the range of 700 C to 950 C to convert silicon (Si) into silicon-oxide (SiO2). In another embodiment, the insulating layer 201 may be made simply through an oxide deposition process. In the event that a portion of the sidewalls of recessed device areas 101 become surrounded by silicon substrate 100 instead of STI 102, which may be caused due to the depth of recessed device areas 101 being made deeper than the depth of STI 102, the exposed sidewalls of silicon material may be converted into silicon-oxide as well or may be covered by the oxide deposited thereupon. The recessed area and surrounding STI 102, which forms sidewalls of the recessed area, creates a guiding structure within which carbon nanotubes may be placed with orientation thereof being substantially guided by this guiding structure.

Insulating layer 201 may be formed abut surrounding STI 102 and may be used to insulate the recessed device areas 101 from the underneath silicon substrate 100. Material of insulating layer 201 may be so chosen such that it may be able to alter or modify electrical properties of carbon nanotubes that are to be placed thereupon, such as to alter electrical switching characteristics of the carbon nanotubes that are used to form semiconductor device 10 as being described below in more details with reference to FIGS. 7(*a*) and 7(*b*). Selection of proper material of insulating layer 201 may also be used to enhance mechanical adhesiveness of the nanotubes to substrate 100.

FIG. 3(*a*) and FIG. 3(*b*) are demonstrative illustrations of top and cross-sectional views of a step of a method of forming a semiconductor device using carbon nanotubes according to an embodiment of present invention, following the step illustrated in FIG. 2(*a*) and FIG. 2(*b*). More specifically, according to one embodiment, the method of present invention may include dispersing or placing multiple carbon nanotubes such as one or more layers of carbon nanotubes 301 onto substrate 100 including device areas 101 and STI area 102. More specifically, the dispersed or placed carbon nanotubes 301 may cover both recessed device areas 101, on top of deposited insulating layer 201, and surrounding STI 102.

The disposition of carbon nanotubes 301 may be made through a process known as a surfactant bubble process. During this surfactant bubble process, an aqueous solution containing carbon nanotubes and surfactant, such as sodium dodecyl benzene sulfonate, may be brought into contact with substrate 100 and in particular in the recessed device areas 101. The solution is then drained away in a pre-selected orientation, such as along the long side A of longitudinal direction of rectangular shape of device area 101, which thus provides aligned distribution of carbon nanotubes therein. Alternatively, the carbon nanotubes 301 may be disposed into recessed device areas 101 on top of insulating layer 201 as Langmuir-Blodgett films. More specifically, in this technique, aqueous solution containing carbon nanotubes as a surface layer may be brought into contact with surfaces of substrate 100, such as surface of insulating layer 201, under a pre-selected orientation to provide aligned distribution of carbon nanotubes on top of insulating layer 201.

As being demonstratively illustrated in FIG. 3(*a*), carbon nanotubes 301 may be disposed through the methods described above, or by any other suitable methods, to be substantially aligned with, for example, the longitudinal direction (horizontal direction as in FIG. 3(*a*)) of recessed device areas 101 by careful selection of orientation during the placement of the carbon nanotubes, and be made parallel to each other. The recessed device areas 101 may be referred to hereinafter as a guiding structure. The carbon nanotubes may be disposed or deposited inside the guiding structure to have at least one layer, and in some embodiments more than one layer, that are generally more densely packed than what is demonstratively illustrated in FIG. 3(*a*). A person skilled in the art will appreciate that FIG. 3(*a*) is for illustration purpose only, in order to show each individual carbon nanotubes, and generally carbon nanotubes 301 are more densely populated to form a substantially continuous layer to cover a substantial portion of the bottom surface of guiding structure of recessed device area 101.

Figure 4A:
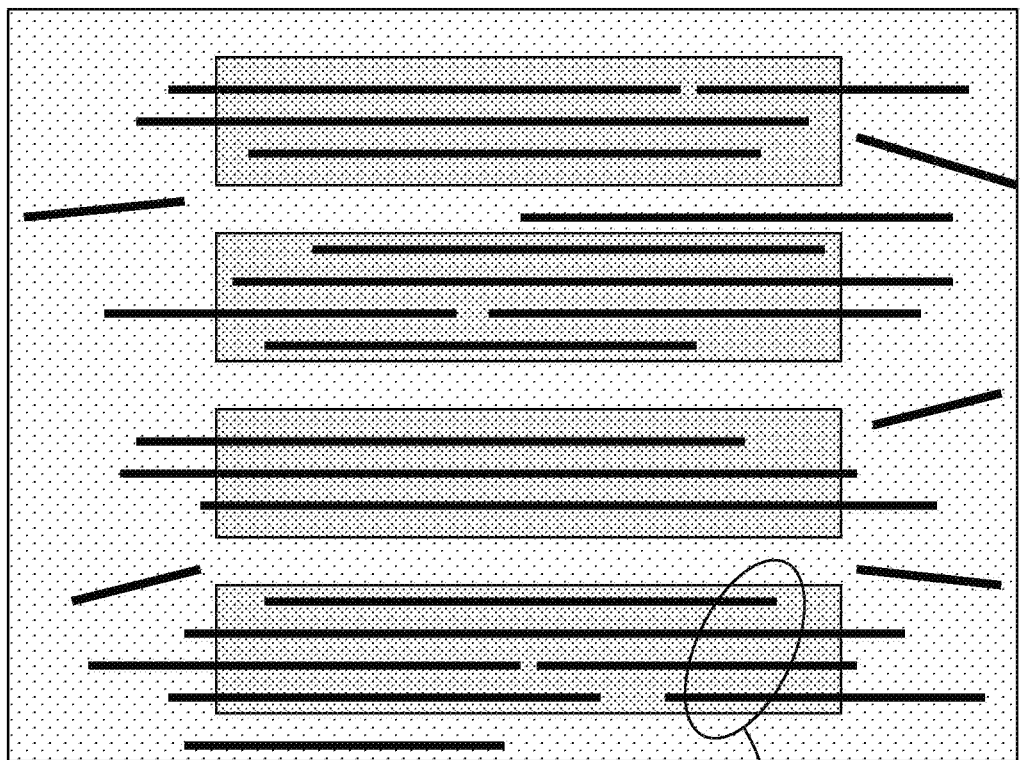
FIGS. 4(a) and 4(b) are demonstrative illustrations of top and cross-sectional views of a step of a method of forming semiconductor devices using carbon nanotubes, following the step illustrated in FIGS. 3(a) and 3(b), according to an embodiment of present invention.
Figure 4B:
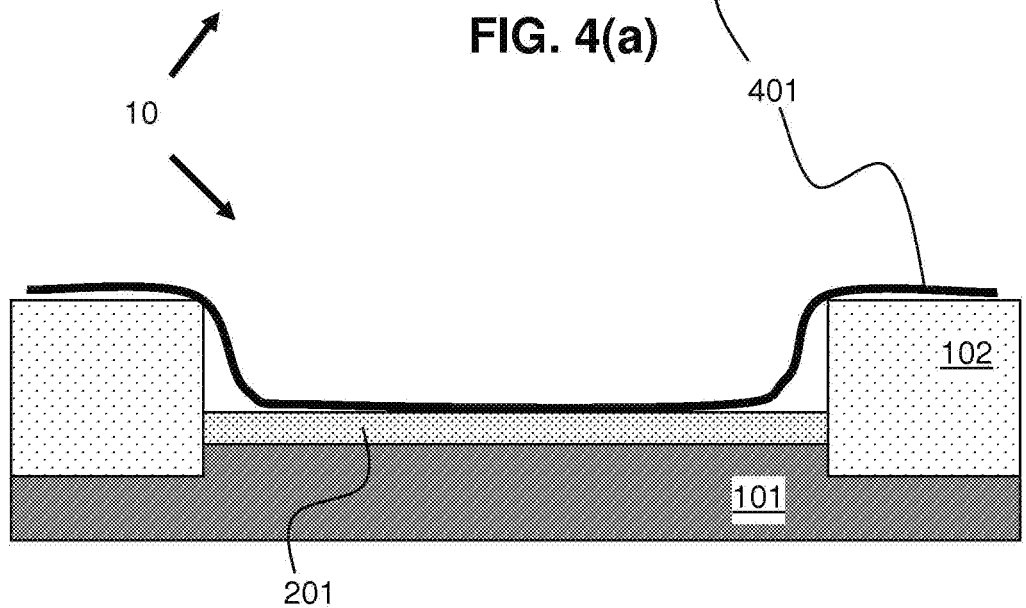

FIG. 4(*a*) and FIG. 4(*b*) are demonstrative illustrations of top and cross-sectional views of a step of a method of forming a semiconductor device using carbon nanotubes according to an embodiment of present invention, following the step illustrated in FIG. 3(*a*) and FIG. 3(*b*). More specifically, one embodiment of present invention includes applying a process that will cause carbon nanotubes 301 to settle down to where they are intended to stay (such as to stay more closely to insulating layer 201) to become a substantially "conformal" layer of carbon nanotubes 401. This may be achieved by, for example, subjecting substrate 100, together with carbon nanotubes 301 on top thereof, to a thermal annealing process under proper temperature for a desired time duration. As a result, the thermal annealing process may cause the initially somehow "rigid" carbon nanotubes 301 to become more flexible, as carbon nanotubes 401 shown in FIGS. 4(*a*) and 4(*b*), and to be able to more closely lay down next to the underneath insulating layer 201 in the device area 101. Some of the carbon nanotubes 401 may also rest on top of STI regions 102.

In one embodiment, the thermal annealing process may cause carbon nanotubes 401 to line substantially the bottom and sidewall surfaces of the device area 101. Device area 101 may be referred to hereinafter as a guiding structure 101 for reasons that it provides guidance to orientation of carbon nanotubes placed or dispersed therein as being described above. Furthermore, embodiment of present invention may apply this thermal annealing process to help increase density of carbon nanotubes 401 packed inside the recessed device areas 101. The increase in carbon nanotube density may be achieved through, for example, a relaxation and settling process of the carbon nanotubes. The thermal annealing process may be performed under a temperature ranging from about 300 C to about 950 C for a time duration of approximately 5 to 300 minutes. It is to be appreciated that above conditions of annealing are crucial and may be critical in order to preserve both the physical, such as strength, and electronic, such as conductivity, properties of the carbon nanotubes.

FIG. 5(*a*) and FIG. 5(*b*) are demonstrative illustrations of top and cross-sectional views of a step of a method of forming a semiconductor device using carbon nanotubes according to an embodiment of present invention, following the step illustrated in FIG. 4(*a*) and FIG. 4(*b*). More specifically, one embodiment of the method of present invention may include depositing an inter layer dielectric (ILD) layer 501 on top of substrate 100 to cover, in particular, the top of carbon nanotubes 401 and the associated structure, such as insulating layer 201 and surrounding STI 102 on top of which some carbon nanotubes 401 may stay as well. ILD layer 501 may be deposited to provide both mechanical stability, which fixates carbon nanotubes 401 to the guiding structure 101 by holding them against the underneath insulating layer 201, and electric isolation to carbon nanotubes 401. In one embodiment, ILD layer 501 may be deposited to include one or more thin film dielectric layers which provide adhesiveness and mechanical stability to the underneath carbon nanotubes 401 by surrounding each carbon nanotubes 401 and holding them in place against the guiding structure 101. In addition, ILD layer 501 may provide electric insulation to carbon nanotubes because of its dielectric property.

On the other hand, dielectric properties of ILD layer 501 may be tuned properly, in order to enhance the mobility of electronic carriers in the carbon nanotubes that are now surrounded by the ILD layer 501. This tuning may be achieved by careful choice of proper deposition conditions such as, for example, by depositing the ILD layer 501 at a relative low temperature and/or performed in a non-oxidizing ambient. Deposition of ILD layer 501 may be made through, for example, chemical vapor deposition (CVD) process or other technique currently known in the art or future developed ILD layer 501 made thereby may be conformal, but embodiment of present invention is not limited in this respect and non-conformal deposition is also contemplated as is shown in FIG. 5(b). More specifically, the method of present invention deposits ILD layer 501 to preferably have a height, inside the guiding structure 101 or the multiple guiding structures 101, that is at least equal to or higher than that of surrounding STI regions 102. ILD layer 501 may sometimes be referred to as a matrix layer 501.

Figure 5A:
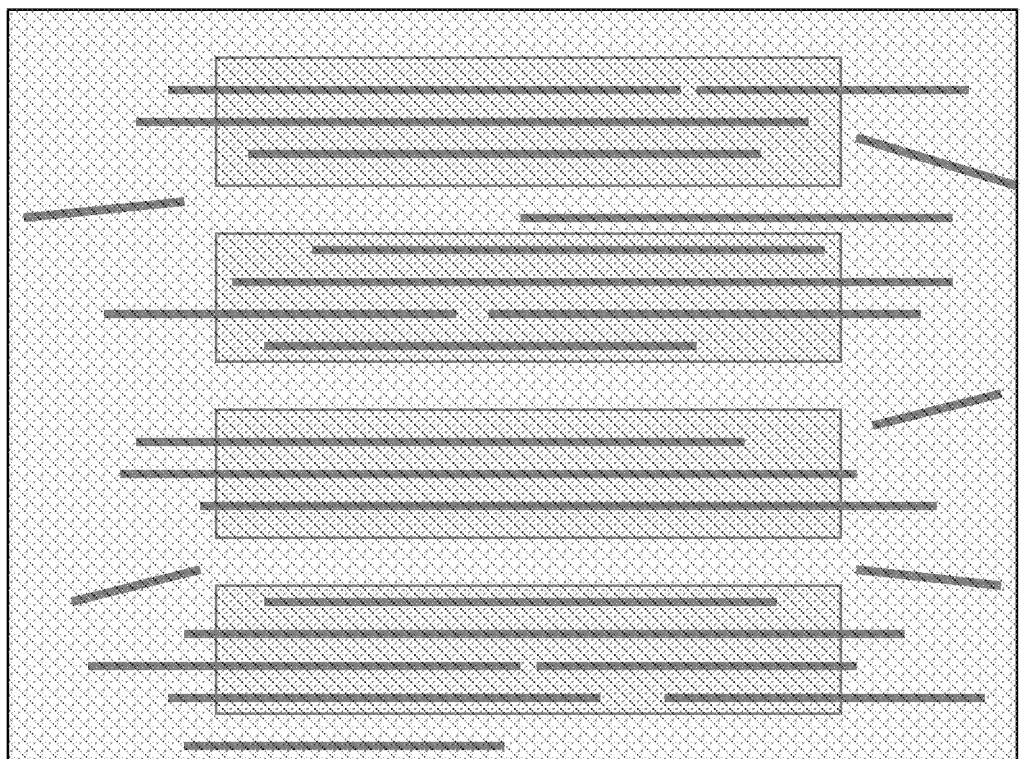
FIGS. 5(a) and 5(b) are demonstrative illustrations of top and cross-sectional views of a step of a method of forming semiconductor devices using carbon nanotubes, following the step illustrated in FIGS. 4(a) and 4(b), according to an embodiment of present invention.
Figure 5B:
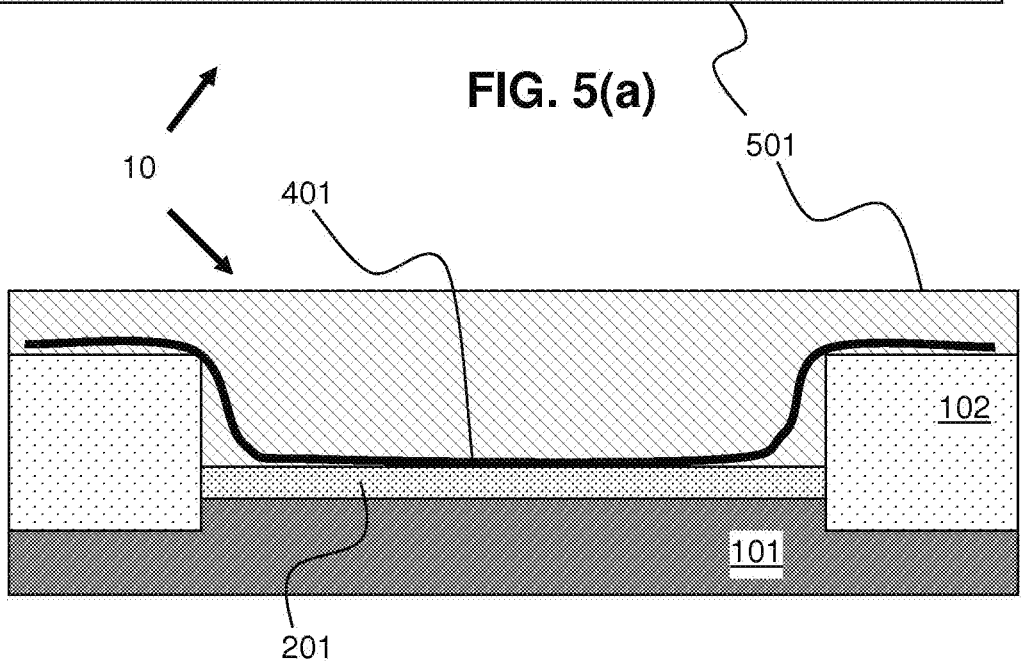
Figure 6A:
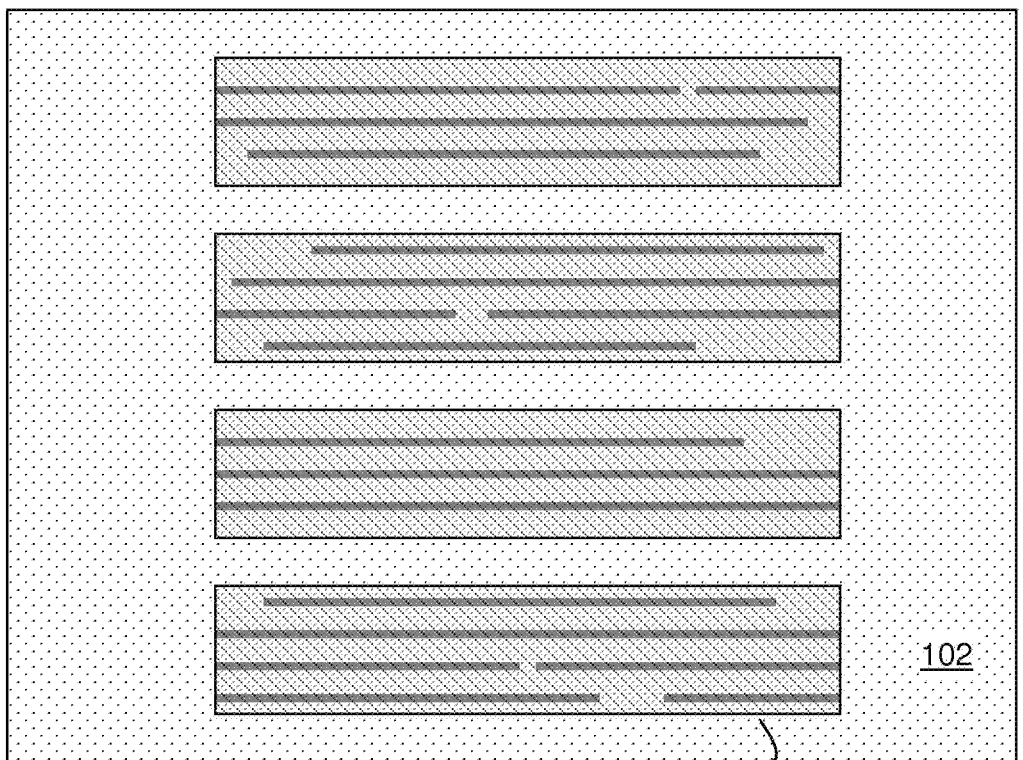
FIGS. 6(a) and 6(b) are demonstrative illustrations of top and cross-sectional views of a step of a method of forming semiconductor devices using carbon nanotubes, following the step illustrated in FIGS. 5(a) and 5(b), according to an embodiment of present invention.
Figure 6B:
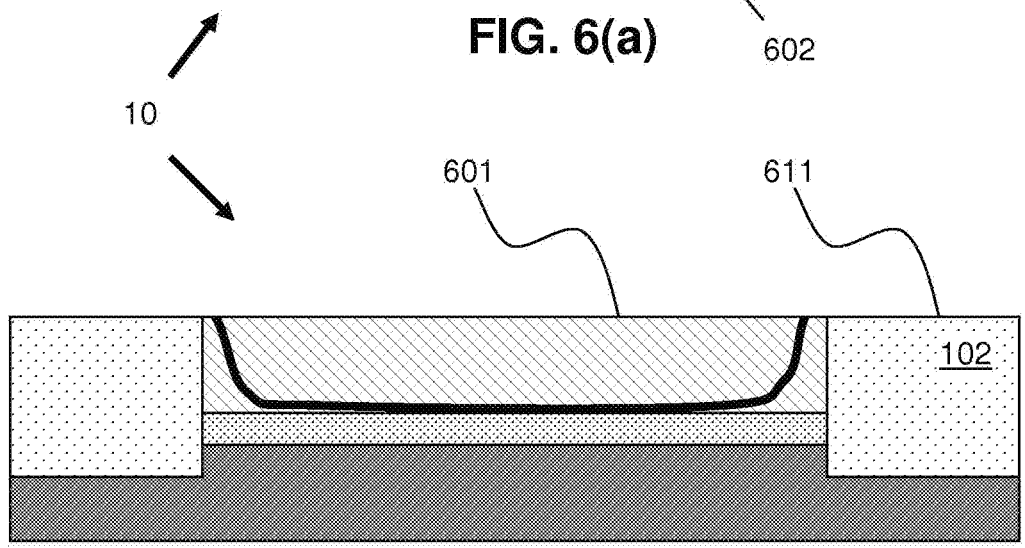

FIG. 6(a) and FIG. 6(b) are demonstrative illustrations of top and cross-sectional views of a step of a method of forming a semiconductor device using carbon nanotubes according to an embodiment of present invention, following the step illustrated in FIG. 5(a) and FIG. 5(b). More specifically, one embodiment of the method of present invention includes removing portions of ILD layer 501 that are above the top surface of STI 102 by applying a CMP process to create a top surface 601 of ILD layer 501. Strategically using underneath STI 102 as an etch-stop layer, the CMP process thus removes excess dielectric material of ILD layer 501 as well as carbon nanotubes 401 that are embedded by this excess dielectric material and are outside guiding structure 101 to be above STI 102. As a result, the CMP process produces one or more dielectric material regions 602 that have carbon nanotubes 401 embedded therein, and carbon nanotubes 401 are substantially aligned within the boundaries thereof.

Figure 7A:
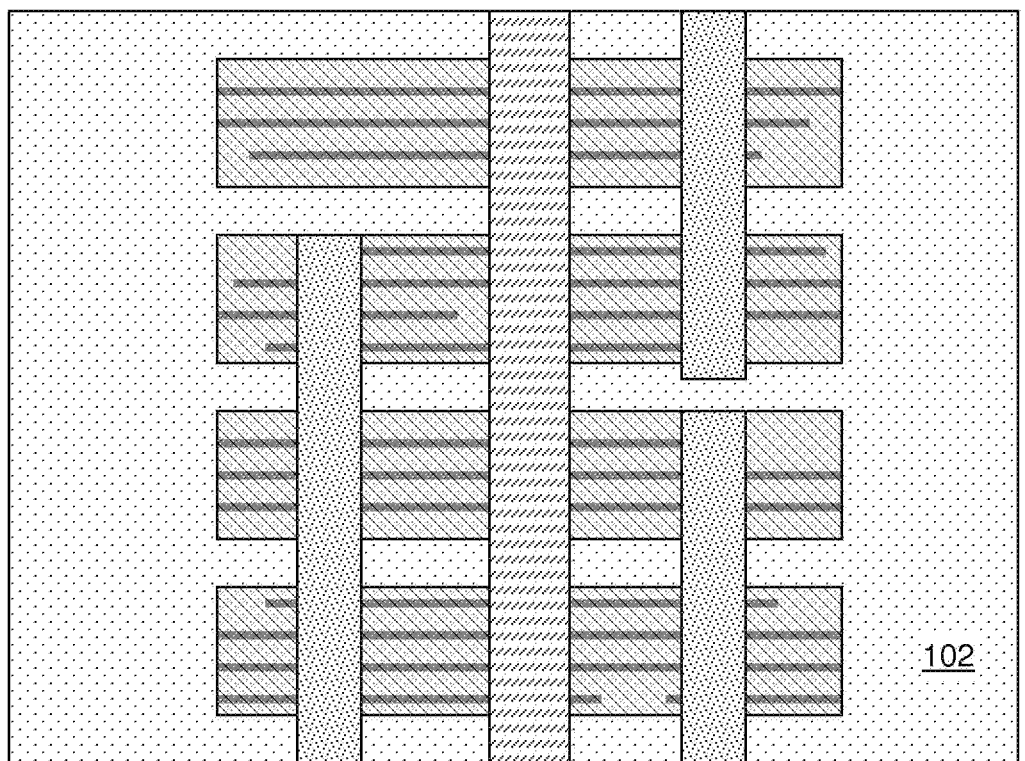
FIGS. 7(a) and 7(b) are demonstrative illustrations of top and cross-sectional views of a step of a method of forming semiconductor devices using carbon nanotubes, following the step illustrated in FIGS. 6(a) and 6(b), according to an embodiment of present invention.
Figure 7B:
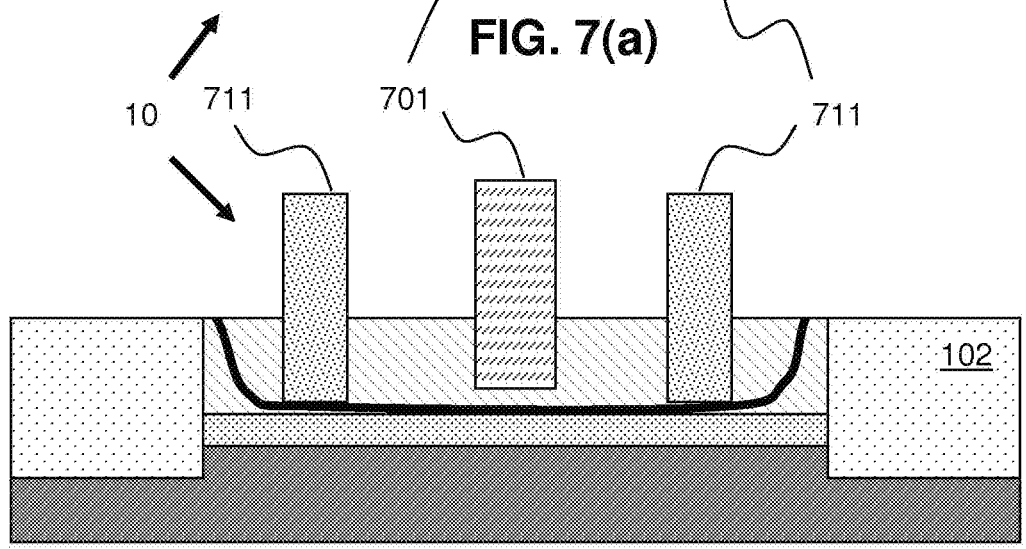

FIG. 7(a) and FIG. 7(b) are demonstrative illustrations of top and cross-sectional views of a step of a method of forming a semiconductor device using carbon nanotubes according to an embodiment of present invention, following the step illustrated in FIG. 6(a) and FIG. 6(b). More specifically, after forming one or more layers of carbon nanotubes 401, inside recessed device areas 101, that are substantially aligned and with the recessed device areas 101 being filled up with dielectric material of ILD layer 501, one embodiment of the method of present invention may include forming gate electrode (gate contact) 701 and source/drain contacts 711 to form semiconductor device 10 which may function as a field-effect-transistor. Depending upon specific design, one gate electrode 701 may be formed to come across one or more groups of carbon nanotubes 401 inside corresponding one or more device areas 101, as being demonstratively illustrated in FIG. 7(a), therefore be used as a commonly connected gate electrode for the one or more transistors. The gate electrode 701 may be formed to be substantially close to underneath carbon nanotubes but not in contact with thereof. Material suitable for gate electrode 701 may include conductive materials suitable for controlling electrical switching properties of the carbon nanotubes 401 underneath thereof. Furthermore, in consideration of other device performance such as work-function, electrical insulating and leakage, and reliability, suitable material for gate electrode 701 may also include the following, or a combination thereof, Ti, TiN, HfOx, W, Al, dielectric oxides, lanthanum, and nitrides, as a non-limiting listing of examples. Portions of carbon nanotubes 401 underneath gate electrode 701 serve as a channel region of their corresponding transistors. In the meantime, one or more source/drain contacts 711 may be formed, to the left and to the right as being illustrated in FIG. 7(a) and FIG. 7(b), that provide electrical connection to the source and drain regions of the transistor.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A semiconductor device, comprising:
   a layer of carbon nanotubes embedded inside a dielectric layer disposed inside a guiding structure, wherein the carbon nanotubes substantially line bottom and sidewall surfaces of said guiding structure;
   a first conductive contact disposed inside said dielectric layer, said first conductive contact being substantially close to but not in contact with said layer of carbon nanotubes; and
   a second and a third conductive contacts disposed inside said dielectric layer next to a right side and a left side of said first conductive contact, said second and third conductive contacts being in contact with said layer of carbon nanotubes.

2. The semiconductor device of claim 1, wherein said guiding structure is disposed inside a semiconductor substrate.

3. The semiconductor device of claim 2, wherein said guiding structure is a shallow trench of rectangular shape filled up by said dielectric layer, said rectangular shape of said shallow trench has a long side A and a short side B with A being at least 4 times longer than B.

4. The semiconductor device of claim 1, wherein said layer of carbon nanotubes is directly on top of an insulating layer insulating said carbon nanotubes from underneath semiconductor substrate.

5. A semiconductor device, comprising:
   multiple guiding structures within a substrate, each guiding structure of said multiple guiding structures including a layer of carbon nanotubes embedded inside a dielectric layer, wherein the carbon nanotubes substantially line bottom and sidewall surfaces of said guiding structure;
   a first conductive contact formed inside said dielectric layer, said first conductive contact being substantially close to but not in contact with said layer of carbon nanotubes; and
   a second and a third conductive contacts formed inside said dielectric layer next to a right side and a left side of said first conductive contact, said second and third conductive contacts being in contact with said layer of carbon nanotubes.

6. The semiconductor device of claim 5, wherein said guiding structure is disposed inside a semiconductor substrate.

7. The semiconductor device of claim 5, wherein said guiding structure is a shallow trench of rectangular shape filled up by said dielectric layer, said rectangular shape of said shallow trench has a long side A and a short side B with A being at least 4 times longer than B.

8. The semiconductor device of claim 5, wherein said layer of carbon nanotubes is directly on top of an insulating layer insulating said carbon nanotubes from underneath semiconductor substrate.

* * * * *